(12) United States Patent
Mai

(10) Patent No.: US 9,287,871 B2
(45) Date of Patent: Mar. 15, 2016

(54) THREE-MODE HIGH-SPEED LEVEL UP SHIFTER CIRCUIT

(71) Applicant: CAPITAL MICROELECTRONICS CO., LTD., Beijing (CN)

(72) Inventor: Rifeng Mai, Beijing (CN)

(73) Assignee: CAPITAL MICROELECTRONICS CO., LTD., Beijing (CN)

( * ) Notice: Subject to any disclaimer, the term of this patent is extended or adjusted under 35 U.S.C. 154(b) by 114 days.

(21) Appl. No.: 14/156,857

(22) Filed: Jan. 16, 2014

(65) Prior Publication Data

US 2015/0130529 A1    May 14, 2015

(30) Foreign Application Priority Data

Nov. 11, 2013  (CN) .......................... 2013 1 0556719

(51) Int. Cl.
*H03L 5/00*       (2006.01)
*H03K 19/0185*    (2006.01)
*H03K 19/003*     (2006.01)

(52) U.S. Cl.
CPC .......... *H03K 19/0185* (2013.01); *H03K 19/003* (2013.01)

(58) Field of Classification Search
None
See application file for complete search history.

(56) References Cited

U.S. PATENT DOCUMENTS

| 8,115,533 B2 * | 2/2012 | Kim .............................. 327/333 |
| 8,169,234 B1 * | 5/2012 | Bourstein ....................... 326/81 |
| 8,183,884 B2 * | 5/2012 | Jung .............................. 326/82 |
| 2011/0298494 A1 * | 12/2011 | Bringivijayaraghavan et al. .............................. 326/87 |
| 2013/0169339 A1 * | 7/2013 | Chen ............................ 327/333 |

* cited by examiner

*Primary Examiner* — Lincoln Donovan
*Assistant Examiner* — Khareem E Almo
(74) *Attorney, Agent, or Firm* — Buchanan Ingersoll & Rooney PC

(57) ABSTRACT

Embodiments of the present invention disclose a level up shifter circuit. The level up shifter circuit further includes two field effect transistors connected in series and a control circuit. Sources of the two field effect transistors and a source of a sixth field effect transistor are respectively connected to a drain of a first field effect transistor and a drain of a second field effect transistor of the conversion circuit, and the control circuit is turned on when a first voltage signal and a third voltage signal are zero at the same time and is turned off in other situations. The level up shifter circuit according to the embodiments of the present invention can effectively solve the problem that an output state is unknown.

6 Claims, 6 Drawing Sheets

| IX | IXB | OUT |
|---|---|---|
| 0 | 0 | 0 |
| 0 | 1 | 0 |
| 1 | 0 | 1 |
| 1 | 1 | Not allowed |

FIG. 7

THREE-MODE HIGH-SPEED LEVEL UP SHIFTER CIRCUIT

BACKGROUND

1. Technical Field

The present invention relates to a level up shifter circuit.

2. Related Art

In the new-generation electronic circuit design, with introduction of low-voltage logic, a problem of input/output logic dissonance usually appears in the system, thereby increasing complexity of system design. A level up shifter circuit may be used in level conversion from a core voltage to an input/output (I/O) voltage.

FIG. 1 shows a conventional level up shifter circuit. When a voltage of an input end IN is a low level, an IXB is a high level, turning on a field effect transistor P1 and pulling down a level at a VA point, thereby turning on a field effect transistor N2, and then pulling up a level at a VB point; when the voltage of the input end IN is a high level, an IX is a high level, turning on a field effect transistor P2 and pulling down the level at the VB point, thereby turning on a field effect transistor N1, and then pulling up the level at the VA point. Through an inverter 101, levels at an output end OUT and the VB point are complementary to each other. Therefore, the level at the output end and the level at the input end basically synchronously change, and the change may be from a level range (for example, 1 v) of the input end IN to, for example, 3.3 v.

However, the circuit has a problem of long regeneration time, especially when VDDIO is much higher than VDDCORE, and this is caused by dragging of the speed of weak conduction of PMOS at the beginning of transition.

FIG. 2 shows another conventional level up shifter circuit. The circuit further includes some boost circuits, on the basis of FIG. 1, used for increasing the reaction speed of the level up shifter circuit. However, the boost circuits may be potentially stressed, because an NMOS gate voltage will be pulled up to be higher than VDDIO.

FIG. 3 shows still another conventional level up shifter circuit. The circuit further includes a level up shifter circuit, which is feasible in the presence of VDDMID. However, the circuit cannot be used in the absence of VDDMID.

In the above circuit, in the absence of VDDCORE, nodes VA and VB will present high impedance or be unknown. Therefore, the situation where an output state of the level up shifter circuit is unknown exists. The problem that the output state is unknown possibly arises when the core voltage is not ready or there is great phase imbalance between the core voltage and the IO voltage. The output state being unknown is dangerous in some applications (for example, hot swap), and this is because there may be a large inrush current flowing into/out of an I/O pin.

SUMMARY

An objective of the present invention is providing a circuit capable of overcoming the above shortcomings.

Embodiments of the present invention provide a level up shifter circuit. The level up shifter circuit includes an input end, for receiving a first voltage signal swinging between a first voltage level and a second voltage level; an output end, outputting a second voltage signal swinging between the first voltage level and a third voltage level, where the third voltage level is greater than the second voltage level; a first field effect transistor of a first type, a second field effect transistor of a second type, a third field effect transistor of the second type, and a fourth field effect transistor of the second type, where the first field effect transistor and the third field effect transistor are connected in series between the first voltage level and the third voltage level, the second field effect transistor and the fourth field effect transistor are connected in series between the first voltage level and the third voltage level, a gate of the first field effect transistor is coupled to the first voltage signal, the second field effect transistor is coupled to the third voltage signal, the third voltage signal is generally complementary to the first voltage signal, a gate of the third field effect transistor is connected to a source of the fourth field effect transistor, a gate of the fourth field effect transistor is connected to a source of the third field effect transistor, and one of the sources of the third field effect transistor and the fourth field effect transistor provides a voltage signal corresponding to the second voltage signal; and further includes a fifth field effect transistor, a sixth field effect transistor and a control circuit, where a drain of the fifth field effect transistor and a drain of the sixth field effect transistor are connected to the third voltage level, a source of the fifth field effect transistor and a source of the sixth field effect transistor are respectively connected to a drain of the first field effect transistor and a drain of the second field effect transistor, and the control circuit is turned on when the first voltage signal and the third voltage signal are zero at the same time and is turned off in other situations.

Preferably, the control circuit includes a seventh field effect transistor and an eighth field effect transistor that are of the second type and connected in series, gates of the seventh field effect transistor and the eighth field effect transistor are respectively coupled to the first voltage signal and the third voltage signal, a drain of the seventh field effect transistor is coupled to a gate of the fifth field effect transistor; and the control circuit further includes a ninth field effect transistor and a tenth field effect transistor that are of the second type and connected in series, gates of the ninth field effect transistor and the tenth field effect transistor are respectively coupled to the first voltage signal and the third voltage signal, and a drain of the ninth field effect transistor is coupled to a gate of the sixth field effect transistor.

Preferably, the control circuit includes a seventh field effect transistor and an eighth field effect transistor that are of the second type and connected in series, gates of the seventh field effect transistor and the eighth field effect transistor are respectively coupled to the first voltage signal and the third voltage signal, and a drain of the seventh field effect transistor is coupled to a gate of the fifth field effect transistor and is coupled to a gate of the sixth field effect transistor.

Preferably, the level up shifter circuit includes an eleventh field effect transistor and a twelfth field effect transistor, a gate of the eleventh field effect transistor is coupled to the first voltage signal, a source thereof is connected to the gate of the third field effect transistor, and a drain thereof is coupled to the third voltage level; a gate of the twelfth field effect transistor is coupled to the third voltage signal, a source thereof is connected to the gate of the fourth field effect transistor, and a drain thereof is coupled to the third voltage level.

The level up shifter circuit according to the embodiments of the present invention can effectively solve the problem that an output state is unknown.

BRIEF DESCRIPTION OF THE DRAWINGS

FIG. 7 shows a truth table of a level up shifter circuit; and

DETAILED DESCRIPTION

The present invention will be clearly and fully described in detail below with reference to the accompanying drawings and specific embodiments. It is obvious that the embodiments to be described are only a part rather than all of the embodiments of the present invention. All other embodiments derived by a person of ordinary skill in the art based on the embodiments of the present invention without carrying out creative activities should fall within the scope of the present invention.

Figure 1:
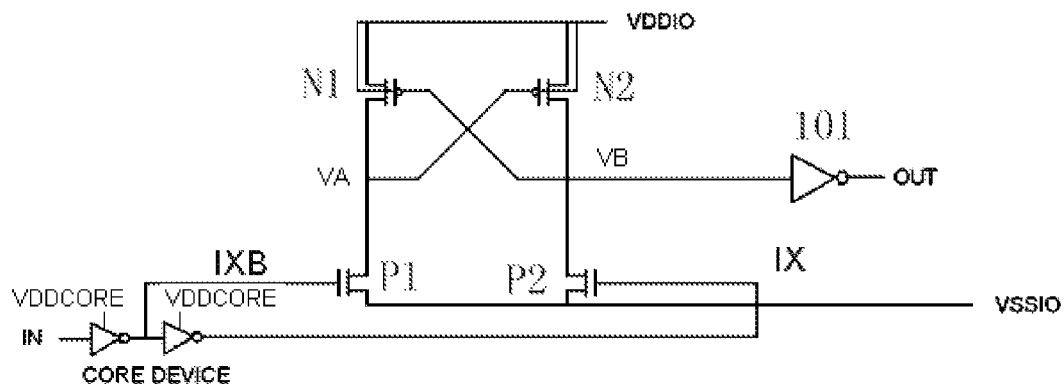
FIG. 1 shows a conventional level up shifter circuit.
Figure 2:
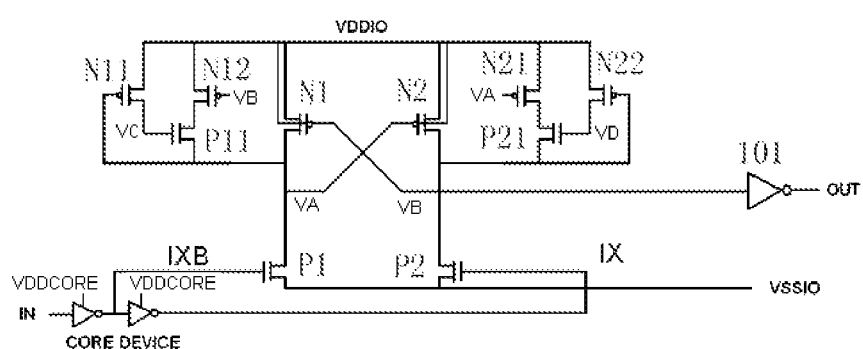
FIG. 2 shows another conventional level up shifter circuit.
Figure 3:
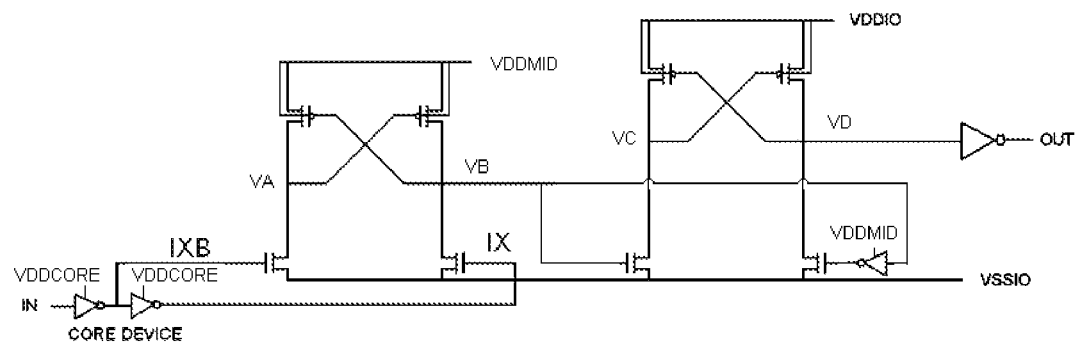
FIG. 3 shows still another conventional level up shifter circuit.
Figure 4:
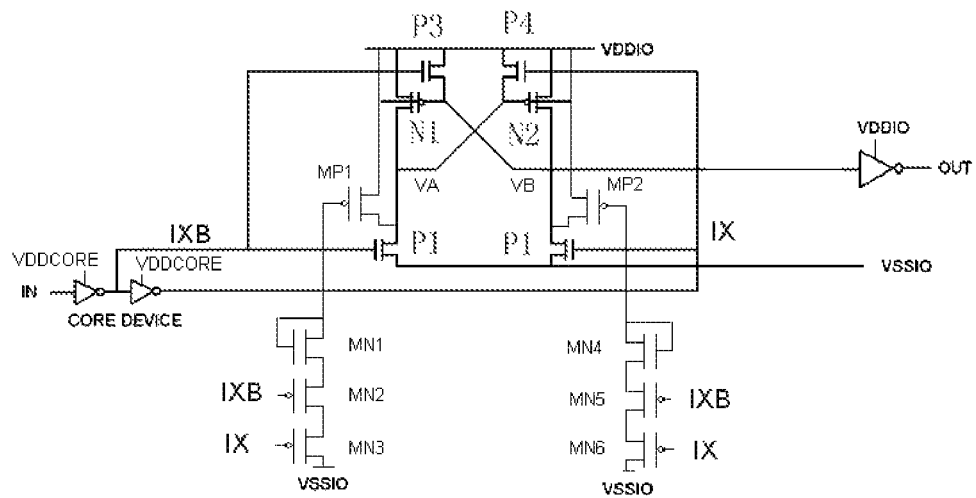
FIG. 4 shows a level up shifter circuit according to an embodiment of the present invention.

FIG. 4 shows a level up shifter circuit according to an embodiment of the present invention. As shown in FIG. 4, the level up shifter circuit includes a conventional level conversion portion, an accelerated conversion portion; as well as a three-state control portion.

The conventional level conversion portion may include at least one input end IN (for example, input ends IXB and IX), for receiving an input signal swinging between a first voltage level VSSIO (for example, about 0 v) and a second voltage level VDDCORE (for example, about 1 v) in a first power domain, where the IXB and the IX may be obtained respectively from an input signal IN through 1 or 2 inverters; and may include at least one output end OUT (for example, output ends VA and VB), for outputting an output signal swinging between the first voltage level and a third voltage level VDDIO (for example, about 3.3 v) in a second power domain, where the OUT may be obtained by the VA or the VB through inversion by using an inverter.

In one example, the conventional level conversion portion may include field effect transistors of a first type, for example, PMOS transistors P1 and P2; and field effect transistors of a second type, for example, NMOS transistors N1 and N2. The P1 and the N1 are connected in series between the VDDIO and the VSSIO, a gate of the P1 is connected to the IXB, a gate of the N1 is connected to the VB; the P2 and the N2 are connected in series between the VDDIO and the VSSIO, a gate of the P2 is connected to the IX, and a gate of the N2 is connected to the VA.

When the input signal IX is 1, the IXB is 0, and the IX is 1. The P1 is turned off, and the P2 is turned on, so as to pull the VB down. Then, the VB turns on the N1, to pull up the VA; the VA then turns off the N2. On the contrary, when the input signal is 0, the P1 is turned on, to pull the VA down, and then the N2 is turned on, to pull up the VB.

Therefore, the output OUT assumes an output signal corresponding to the input signal IN but having a level range between the VDDIO and the VSSIO.

The accelerated conversion portion enhances the speed of state conversion of an output signal. In one example, the accelerated conversion portion includes field effect transistors P3 and P4. The P3 has a gate connected to the IXB, a source connected to the VB, and a drain connected to the VDDIO; the P4 has a gate connected to the IX, a source connected to the VA, and a drain connected to the VDDIO. When the input signal IN is 1, the IX is 1, and the P4 is turned on, so as to pull up a gate level of the N2 to the VDDIO, and then turn off the N2; when the input signal IN is 0, the IXB is 1, and the P3 is turned on, so as to pull up a gate level of the N1 to the VDDIO, and then turn off the N1. Therefore, the process of level conversion can be accelerated.

The three-state control portion provides circuit operations in a third state. In one example, the three-state control portion includes field effect transistors (for example, NMOS transistors) MN1-6 of the second type, and field effect transistors MP1 and MP2 of the first type. The MN1 to the MN3 are connected in series, a drain and a gate of the MN1 are connected with each other, to assume a resistance state, a gate of the MN2 is coupled to the IXB, a gate of the MN3 is coupled to the IX, the drain of the MN1 is connected to a gate of the MP1, a drain of the MP1 is connected to the VDDIO, and a source of the MP1 is connected to the VA; the MN4 to the MN6 are connected in series, a drain and a gate of the MN4 are connected with each other, to assume a resistance state, a gate of the MN5 is coupled to the IXB, a gate of the MN6 is coupled to the IX, the drain of the MN4 is connected to a gate of the MP2, a drain of the MP2 is connected to the VDDIO, and a source of the MP2 is connected to the VB.

The following description is about exemplary operations of the level up shifter circuit in three states.

Generally, when the input signal IN is valid, the IX and the IXB are complementary to each other, thus, one of the MN2 and the MN3 is turned on, and the other is turned off; one of the MN5 and the MN6 is turned on, and the other is turned off. Therefore, the MP1 and the MP2 are both turned off generally in the case that the input signal IN is valid.

In the absence of the VDDCORE, in other words, when the input signal IN is invalid, the IX and the IXB may be logic-low at the same time, at this time, the MN2 and the MN3 are both turned on, and the MN5 and the MN6 are both turned on. Because the MN1 and the MN4 actually function as resistors, gates of the MP1 and the MP2 are at low levels, and the MP1 and the MP2 are turned on, so as to pull up the VA and the VB to a clearly defined state VDDIO. In one example, the MP1 and the MP2 may use a weakly conducting PMOS, which thus may not have a negative effect on the operating speed. Meanwhile, the MP1 and the MP2 almost do not absorb current, because they are only weakly turned on.

Figure 7:
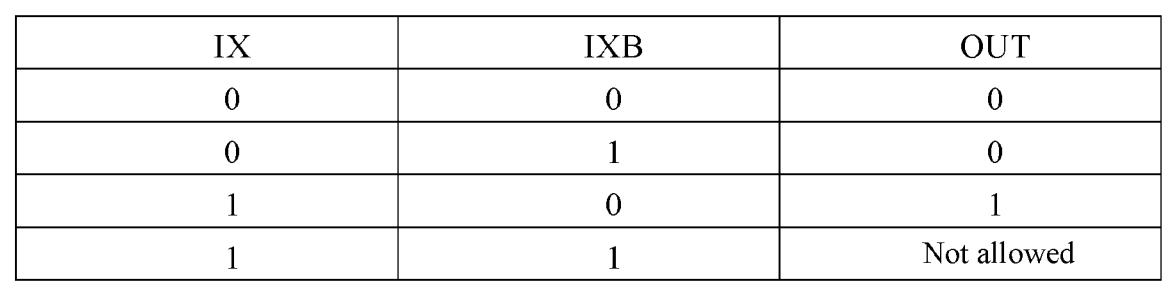

FIG. 7 shows a truth table of a level up shifter circuit. The table indicates that the level up shifter circuit according to the embodiments of the present invention can not only correctly deal with the situation where IX and IXB are inverted with each other, but also deal with the situation where IX=IXB=0.

Figure 5:
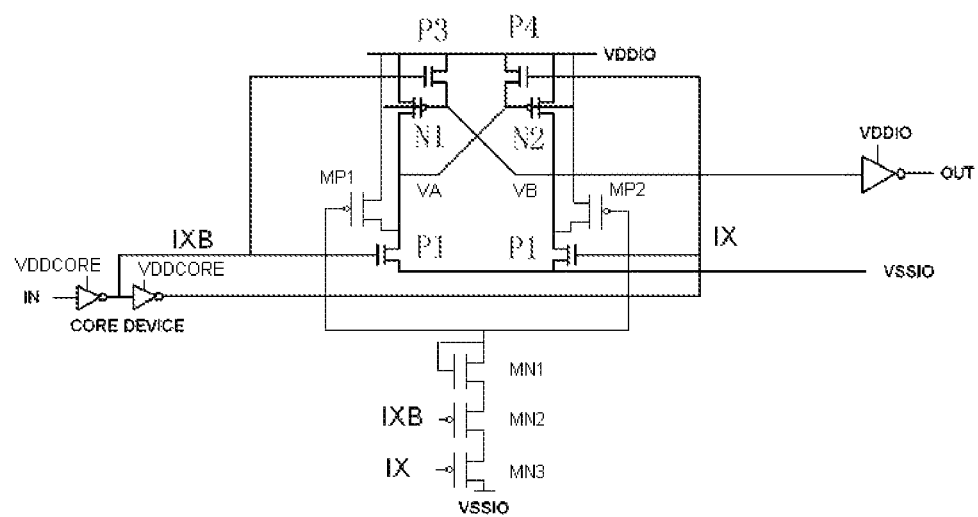
FIG. 5 is a schematic view of a level up shifter circuit according to another embodiment of the present invention.

FIG. 5 is a schematic view of a level up shifter circuit according to another embodiment of the present invention. Different from the circuit in FIG. 4, in the three-state control portion of FIG. 5, gates of field effect transistors MP1 and MP2 are jointly connected to one and the same circuit, which includes MN1, MN2 and MN3 connected in series. A gate and a drain of the MN1 are connected with each other, to assume an impedance state; and gates of the MN2 and the MN3 are respectively connected to IXB and IX signals.

Similar to FIG. 4, in the absence of VDDCORE, in other words, when the input signal IN is invalid, the IX and the IXB may be logic-low, thus, the MN2 and the MN3 are both turned on, and gates of the MP1 and the MP2 are pulled down to low levels, so as to pull up the VA and the VB to a clearly defined state VDDIO. The MP1 and the MP2 may use a weak conducting PMOS, which thus may not have a negative effect on the operating speed.

Figure 6:
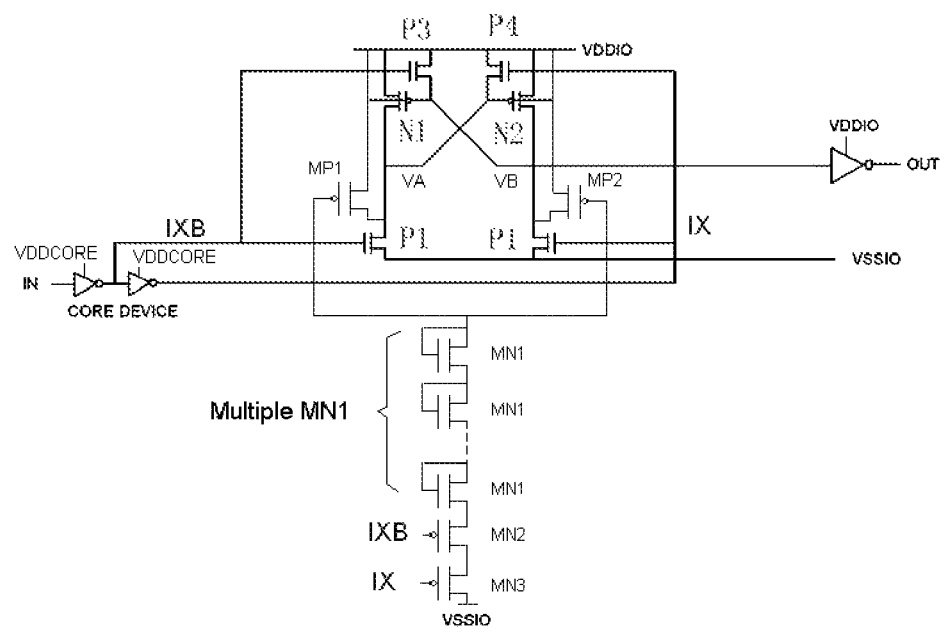
FIG. 6 is a schematic view of a level up shifter circuit according to a third embodiment of the present invention.

FIG. 6 is a schematic view of a level up shifter circuit according to a third embodiment of the present invention. Different from FIG. 5, the level up shifter circuit in FIG. 6 includes a plurality of MN1s connected in series each having a gate and a drain connected with each other, and these MN1s are equivalent to resistors. The number of the MN1 depends on a difference in level between VDDIO and VDDCORE. The circuit helps to further reduce quiescent current consumption during conventional working (IX=0, IXB=1; IX=1, IXB=0) according to the VDDIO range. By selecting an appropriate number of the MN1s, the quiescent current consumption may be lowered to a range of pA (e-12).

Figure 8:
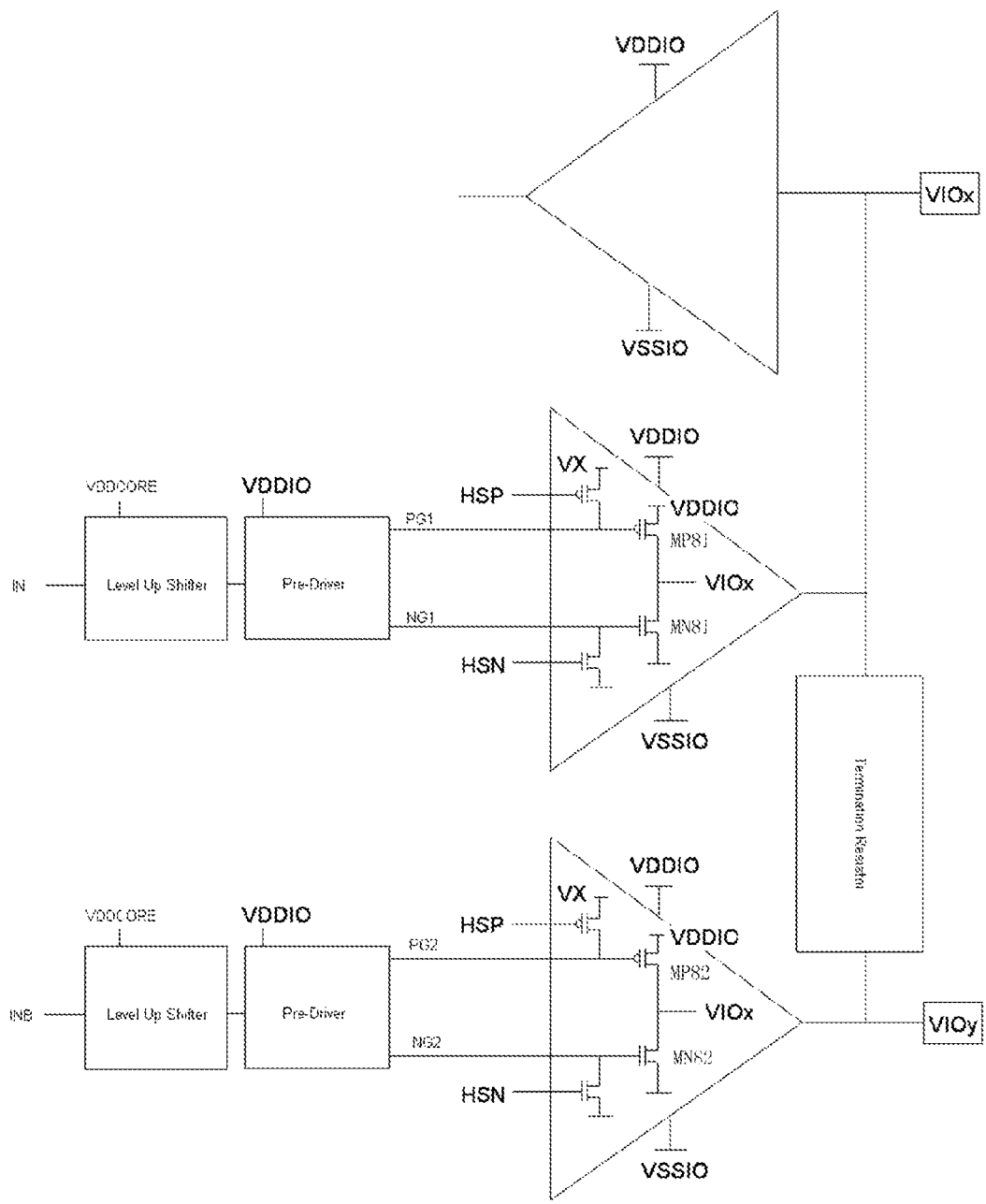
FIG. 8 shows a hot-swap control circuit for LVDS I/O.

FIG. 8 shows a hot-swap control circuit for low-voltage differential signal technology interface LVDS I/O. In the absence of VDDCORE, IN=INB=0, the situation where PG1=PG2=0 and NG1=NG2=VDDIO may occur in the conventional level up shifter circuit, this means MP81=MP82, MN81 and MN82 are both turned on, and currents may flow from VIOx to VIOy or vice versa. The level up shifter circuit according to the embodiments of the present invention can avoid the inrush current, because the PG1 and the PG2 as well as the NG1 and the NG2 can have a well defined state, even if VDDCORE=0 v. By setting PG1=PG2=VDDIO and NG1=NG2=VSSIO when VDDCORE=0 v, no current flows into or out of VIOx (VIOy). This will avoid potential risk in hot swap applications.

The objectives, technical solutions, and beneficial effects of the present invention have been described in further detail through the above specific embodiments. It should be understood that the above descriptions are merely specific embodiments of the present invention, but not intended to limit the protection scope of the present invention. Any modification, equivalent replacement, or improvement made without departing from the spirit and principle of the present invention should fall within the protection scope of the present invention.

What is claimed is:

1. A level up shifter circuit, comprising an input end, for receiving a first voltage signal swinging between a first voltage level and a second voltage level; an output end, outputting a second voltage signal swinging between the first voltage level and a third voltage level, wherein the third voltage level is greater than the second voltage level; a first field effect transistor (P1) of a first type, a second field effect transistor (P2) of a first type, a third field effect transistor (N1) of the second type, and a fourth field effect transistor (N2) of the second type, wherein the first field effect transistor and the third field effect transistor are connected in series between the first voltage level and the third voltage level, the second field effect transistor and the fourth field effect transistor are connected in series between the first voltage level and the third voltage level, a gate of the first field effect transistor is coupled to the first voltage signal, the second field effect transistor is coupled to the third voltage signal, the third voltage signal is generally complementary to the first voltage signal, a gate of the third field effect transistor is connected to a source of the fourth field effect transistor, a gate of the fourth field effect transistor is connected to a source of the third field effect transistor, and one of the sources of the third field effect transistor and the fourth field effect transistor provides a voltage signal corresponding to the second voltage signal; and further comprising a fifth field effect transistor (MP1), a sixth field effect transistor (MP2) and a control circuit, wherein a drain of the fifth field effect transistor and a drain of the sixth field effect transistor are connected to the third voltage level, a source of the fifth field effect transistor and a source of the sixth field effect transistor are respectively connected to a drain of the first field effect transistor and a drain of the second field effect transistor; when the first voltage signal and the third voltage signal are zero at the same time, the control circuit is turned on so as to turn on the fifth field effect transistor and the sixth field effect transistor and an output is determined instead of high impedance; and the control circuit is turned off in other situations.

2. The level up shifter circuit according to claim 1, wherein the control circuit comprises a seventh field effect transistor (MN2) and an eighth field effect transistor (MN3) that are of the second type and connected in series, gates of the seventh field effect transistor and the eighth field effect transistor are respectively coupled to the first voltage signal and the third voltage signal, a drain of the seventh field effect transistor is coupled to a gate of the fifth field effect transistor; and the control circuit further comprises a ninth field effect transistor (MN5) and a tenth field effect transistor (MN6) that are of the second type and connected in series, gates of the ninth field effect transistor and the tenth field effect transistor are respectively coupled to the first voltage signal and the third voltage signal, and a drain of the ninth field effect transistor is coupled to a gate of the sixth field effect transistor.

3. The level up shifter circuit according to claim 1, wherein a seventh field effect transistor (MN2) and an eighth field effect transistor connected in series further comprise at least one field effect transistor, whose drain and gate are connected with each other, and the at least one field effect transistor is coupled to a gate of the fifth field effect transistor; a ninth field effect transistor (MN2) and a tenth field effect transistor connected in series further comprise at least one field effect transistor, whose drain and gate are connected with each other, and the at least one field effect transistor is coupled to a gate of the sixth field effect transistor.

4. The level up shifter circuit according to claim 1, wherein the control circuit comprises a seventh field effect transistor (MN2) and an eighth field effect transistor (MN3) that are of the second type and connected in series, gates of the seventh field effect transistor and the eighth field effect transistor are respectively coupled to the first voltage signal and the third voltage signal, and a drain of the seventh field effect transistor is coupled to a gate of the fifth field effect transistor and is coupled to a gate of the sixth field effect transistor.

5. The level up shifter circuit according to claim 1, wherein a seventh field effect transistor (MN2) and an eighth field effect transistor connected in series further comprise at least one field effect transistor, whose drain and gate are connected with each other, and the at least one field effect transistor is coupled to a gate of the fifth field effect transistor and a gate of the sixth field effect transistor.

6. The level up shifter circuit according to claim 1, comprising an eleventh field effect transistor (P3) and a twelfth field effect transistor (P4), wherein the eleventh field effect transistor has a gate coupled to the first voltage signal, a source connected to the gate of the third field effect transistor, and a drain coupled to the third voltage level; the twelfth field effect transistor has a gate coupled to the third voltage signal, a source connected to the gate of the fourth field effect transistor, and a drain coupled to the third voltage level.

* * * * *